(12) United States Patent
Moriyama et al.

(10) Patent No.: US 7,376,801 B2
(45) Date of Patent: May 20, 2008

(54) POWER SAVING DATA STORAGE CIRCUIT, DATA WRITING METHOD IN THE SAME, AND DATA STORAGE DEVICE

(75) Inventors: Katsutoshi Moriyama, Saga (JP); Hironobu Mori, Nagasaki (JP); Hisanobu Tsukazaki, Nagasaki (JP)

(73) Assignee: Sony Corporation (JP)

( * ) Notice: Subject to any disclaimer, the term of this patent is extended or adjusted under 35 U.S.C. 154(b) by 297 days.

(21) Appl. No.: 10/505,431

(22) PCT Filed: Mar. 17, 2003

(86) PCT No.: PCT/JP03/03196

§ 371 (c)(1),
(2), (4) Date: Aug. 24, 2004

(87) PCT Pub. No.: WO03/079365

PCT Pub. Date: Sep. 25, 2003

(65) Prior Publication Data

US 2005/0235118 A1    Oct. 20, 2005

(30) Foreign Application Priority Data

Mar. 20, 2002 (JP) .............................. 2002-079528

(51) Int. Cl.
*G06F 12/00* (2006.01)
(52) U.S. Cl. ....................................... 711/154; 711/101
(58) Field of Classification Search ................ 711/101, 711/154
See application file for complete search history.

(56) References Cited

U.S. PATENT DOCUMENTS 5,412,402 A * 5/1995 Searby et al. ............... 345/639

(Continued)

FOREIGN PATENT DOCUMENTS

JP         59-135698         8/1984

(Continued)

OTHER PUBLICATIONS

Supplementary European Search Report, Oct. 20, 2006.

(Continued)

*Primary Examiner*—Hyung S. Sough
*Assistant Examiner*—Shawn Eland
(74) *Attorney, Agent, or Firm*—Rader Fishman & Grauer PLLC; Ronald P. Kananen

(57) ABSTRACT

It is an object to provide, in a data storage circuit for storing data, a power saving data storage circuit and a data writing method in the data storage circuit, and, further, to provide a data storage device. Thus, in the present invention, reading out existing data stored in a storage element M is performed prior to performing writing of new data to the storage element M to compare the existing data and the new data. The data storage circuit is configured so that in a case where the existing data and the new data are identical with each other, writing to the storage element M is not performed, and, in a case where the existing data and the new data are not identical with each other, writing of the new data to the storage element M is performed. The data storage circuit is formed on a semiconductor substrate to have a data storage device.

7 Claims, 4 Drawing Sheets

U.S. PATENT DOCUMENTS 6,052,302 A * 4/2000 Moyer et al. ............... 365/173
2002/0145902 A1 * 10/2002 Kunikiyo et al. ............. 365/97

FOREIGN PATENT DOCUMENTS

| JP | 07-065586 | 3/1995 |
| JP | 09-063286 | 3/1997 |
| JP | 2003-016779 | 1/2003 |

OTHER PUBLICATIONS

Japanese Office Application No. 2002-079528 dated Jun. 20, 2006.

* cited by examiner

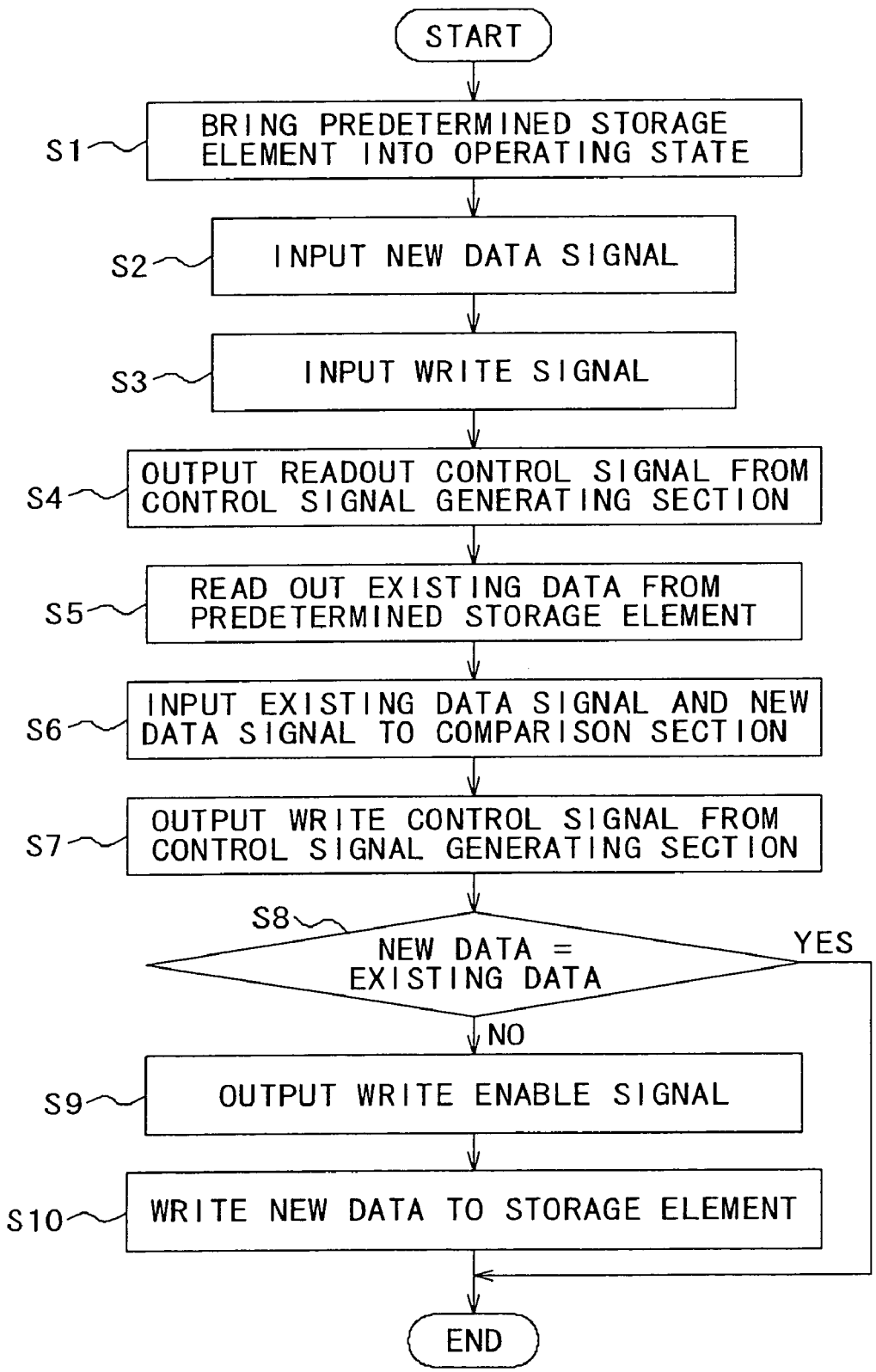

POWER SAVING DATA STORAGE CIRCUIT, DATA WRITING METHOD IN THE SAME, AND DATA STORAGE DEVICE

TECHNICAL FIELD

The present invention relates to a data storage circuit for storing predetermined data, a data writing method in the data storage circuit, and a data storage device.

BACKGROUND ART

Conventionally, in electronic computers including personal computers, a data storage circuit composed of a combination of a large number of storage elements is provided in a semiconductor device such as a CPU and a memory IC. Data are stored in the data storage circuit so as to execute various types of processing.

The storage elements in such a data storage circuit are normally configured so that 1-bit data is stored in each of the storage elements. More specifically, the storage element is capable of keeping two different states. When one state is represented by "0" and the other state by "1", data of "0" or "1" is stored by keeping any one of the states. A large number of such storage elements are provided to enable the storage of data in an amount corresponding to the number of provided storage elements.

Storage elements having a wide variety of structures are known as such storage elements. For example, a storage element of a flash memory, which consists of a N-channel MOSFET (Metal Oxide Silicon Field Effect Transistor), is capable of storing data "0" and "1" while a state where charges are accumulated in a floating gate layer provided for a gate electrode section is represented by "1" and a state where no charge is accumulated in the floating gate layer is represented by "0" or vice versa.

A storage element of a MRAM (Magnetic Random Access Memory), which consists of a ferromagnetic tunnel junction element, is capable of storing data "0" and "1" while a state where the direction of magnetization of a free magnetization layer is anti-parallel to that of a fixed magnetization layer is represented by "1" and a parallel state by "0" or vice versa.

In a data storage circuit provided with these storage elements, in a case where data of "0" or "1" is newly stored in a certain storage element, a state of change is induced by application of a predetermined voltage to the storage element or by allowing a current to pass therethrough. At this time, the storage element is forced into a predetermined state by application of a predetermined voltage to the storage element or by allowing a current to pass therethrough, regardless of whether existing data that is previously stored in the storage element is "0" or "1", thereby storing new data.

In a data storage device consisting of a semiconductor device including the conventional data storage circuit described above, however, new data is written by application of a voltage to the storage element or by allowing a current to pass therethrough even though the previously stored existing data and the new data to be written are identical. Therefore, there is a problem that substantially ineffective power consumption is generated which hinders power saving.

In particular, the storage element used for the flash memory or the MRAM described above requires a considerable amount of electric power in view of its structure to cause a change of state in order to write new data. Therefore, wasteful power consumption is increased in the data storage circuit, such as the flash memory or the MRAM, by the corresponding amount to further hinder power saving.

DISCLOSURE OF THE INVENTION

Therefore, in order to solve the above problems, a data storage circuit of the present invention is configured to have a comparison section for reading out existing data stored in a storage element to compare the existing data and new data with each other prior to writing of the new data to the storage element, and so that, in the comparison section, if the exiting data and the new data are identical with each other, the writing to the storage element is not performed, and if the existing data and the new data are not identical with each other, the new data is written to the storage element.

The data storage circuit is also characterized by including a control signal generating section for generating a readout control signal for performing readout control of the existing data and a write control signal for performing write control of the new data, and being configured so that the existing data and the new data are compared with each other in the comparison section in accordance with the control signal from the control signal generating section.

According to a data writing method in the data storage circuit of the present invention, it is arranged so that readout processing for reading out existing data stored in a predetermined storage element is performed prior to write processing of new data to the storage element so as to compare the exiting data and the new data with each other, and if the existing data and the new data are identical with each other, the write processing to the storage element is not performed, and if the data not identical, the write processing of the new data to the storage element is performed.

Furthermore, the data writing method is also characterized by generating a readout control signal and a write control signal in accordance with a write signal input to the data storage circuit so as to read out the existing data in accordance with the readout control signal and to compare it with the new data in accordance with the write control signal.

In order to solve the above problems, a data storage device of the present invention is provided with a comparison section for reading out existing data stored in a storage element to compare the existing data and new data with each other prior to writing of the new data to the storage element, and the device is configured so that, in the comparison section, if the exiting data and the new data are identical with each other, the writing to the storage element is not performed, and if the existing data and the new data are not identical with each other, the new data is written to the storage element.

Furthermore, the data storage device is also characterized by being provided with a control signal generating section for generating a readout control signal for performing readout control of the existing data and a write control signal for performing write control of the new data, and in that the existing data and the new data are compared with each other in the comparison section in accordance with the control signal from the control signal generating section.

Moreover, the data storage device is also characterized in that the comparison section thereof is provided with: a new data retention section for temporarily retaining the new data; an existing data retention section for temporarily retaining the existing data; and a write enable signal generating section for comparing the new data retained in the new data retention section and the exiting data retained in the existing data retention section with each other to control an output of the write enable signal, and the new data is temporarily retained in the new data retention section while the existing data is temporarily retained in the exiting data retention section in accordance with the readout control signal output from the control signal generating section so as to compare the new data retained in the new data retention section and the existing data retained in the existing data retention section with each other in accordance with the write control signal output from the control signal generating section.

BRIEF DESCRIPTION OF THE DRAWINGS

FIG. 5 is a flow chart of a data writing process in the data storage circuit.

BEST MODE FOR CARRYING OUT THE INVENTION

Figure 1:
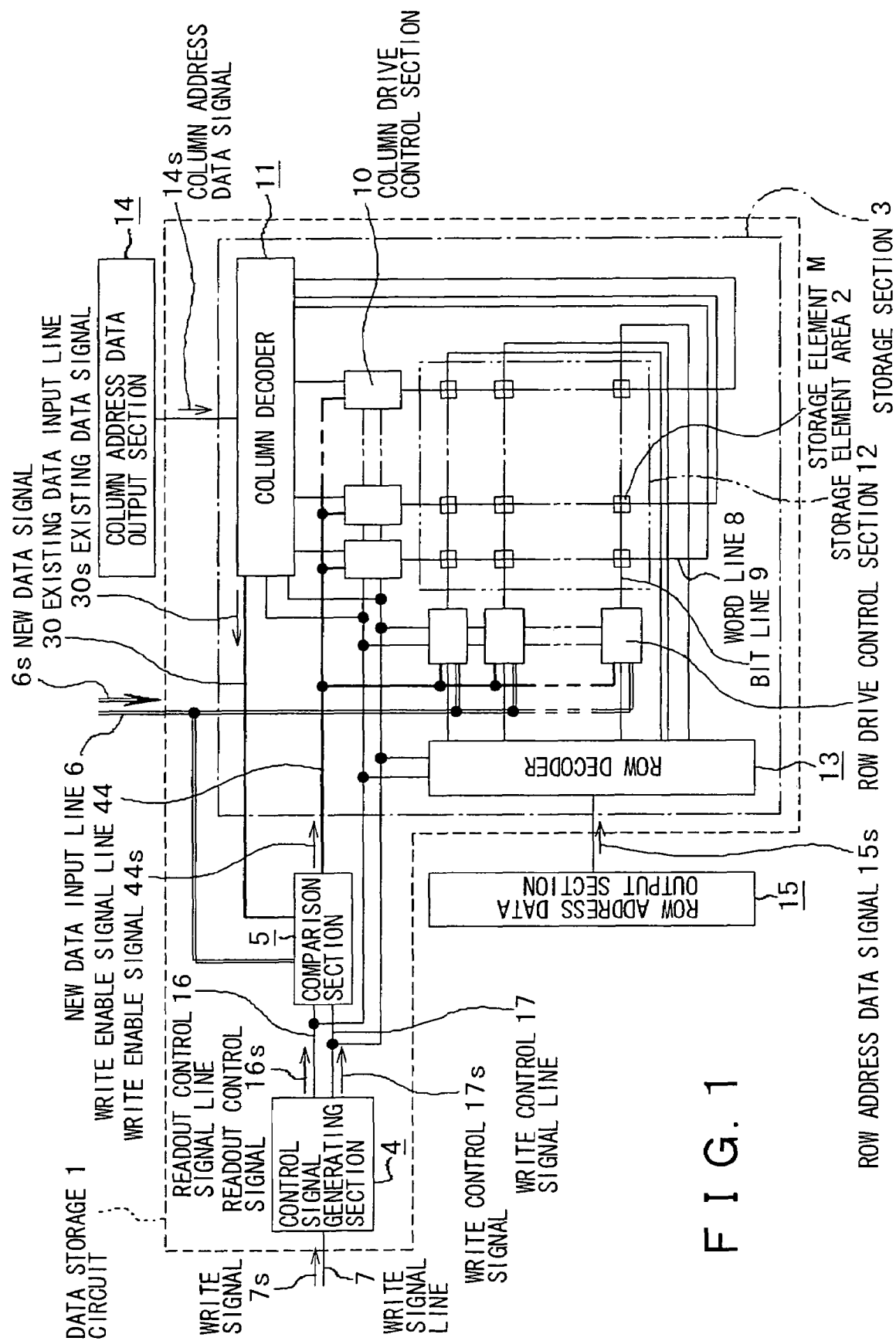
FIG. 1 is a block diagram showing a data storage circuit according to the present invention.

A data storage circuit and a data storage device formed so as to include the data storage circuit according to the present invention respectively include a storage section consisting of a combination of a plurality of storage elements. If data is written to the data storage circuit and the data storage device, existing data already stored in a predetermined storage element is read out in advance before new data is stored in the storage element so as to compare the existing data and the new data with each other. If they are identical with each other, the new data is not written; only if the dates are not identical with each other, the new data is written.

More specifically, in a case where it is not necessary to induce a change of state in the storage element because the existing data and the new data are identical with each other, a voltage is not applied to the storage element or a current is not allowed to pass therethrough. As a result, power consumption can be reduced by the corresponding amount to achieve a power saving.

In particular, since a probability that the existing data and the new data will be identical with each other is about 50%, the power required to write the data to the storage element can be approximately halved, which greatly contributes to the power saving of the data storage circuit and the data storage device.

The data storage device is formed by providing the data storage circuit on a semiconductor substrate. In the following description, an explanation regarding the data storage circuit provided on the semiconductor substrate also serves as an explanation regarding the data storage device.

However, the data storage circuit is not limited to those provided on the semiconductor substrate; it may be provided on an appropriate substrate other than the semiconductor substrate. Furthermore, the structural form of the data storage device is not limited to that in which the data storage circuit is provided on a single semiconductor substrate; necessary circuits may be provided on a plurality of semiconductor substrates so as to be connected through an appropriate electric wiring.

A comparison for determining if the exiting data and the new data are identical with each other or not is performed in the comparison section provided in the data storage circuit. After the existing data and the new data are fetched into the comparison section, comparison processing is executed.

Furthermore, a control signal generating section for detecting a write signal so as to generate a control signal described below is provided in the data storage circuit. The write signal is a so-called write enable signal. By detecting the write signal in the control signal generating section, the new data can be written to a predetermined storage element in accordance with a new data signal input from a new data input line connected to the data storage circuit.

In particular, the control signal generating section generates a readout control signal for performing readout control of the existing data and a write control signal for performing write control of the new data as a result of the detection of the write signal.

Then, the control signal generating section first outputs the readout control signal so as to read out the existing data in the predetermined storage element and to fetch it into the comparison section. Subsequently, the control signal generating section outputs the write control signal to compare the existing data and the new data fetched into the comparison section with each other. If the existing data and the new data are not identical with each other, the comparison section outputs the write enable signal so as to execute writing of the new data to the storage element.

On the other hand, if the existing data and the new data are identical with each other, the comparison section does not output the write enable signal. Accordingly, the writing of new data to the storage element is not executed, so that wasteful power consumption is suppressed.

An embodiment of the present invention will be described in detail below with reference to the drawings.

FIG. 1 is a block diagram showing a data storage circuit 1 according to this embodiment. The data storage circuit 1 includes: a storage section 3 having a storage element area 2 in which a plurality of storage elements M are appropriately arranged; a control signal generating section 4 for detecting a write signal 7s that brings the storage section 3 into an input receiving state of new data; and a comparison section 5 for performing write control of the new data, which is stored in a predetermined one of the storage elements M of the storage section 3, to the storage element M in accordance with the detection of the write signal 7s.

Furthermore, to the data storage circuit 1, a new data input line 6 for inputting the new data to the storage section 3 is connected while a write signal line 7 for inputting a write signal 7s to the control signal generating section 4 is also connected.

In this embodiment, a ferromagnetic tunnel junction element is used as each of the storage elements M. The ferromagnetic tunnel junction elements are provided at the crossing points between a plurality of word lines 8 and bit lines 9 provided in a grid pattern in the storage element area 2. Although not shown, sense lines for reading-out are provided in parallel to the word lines 8 so as to read out data stored in the ferromagnetic tunnel junction elements.

Although the following description is given for a case where the storage element M is a ferromagnetic tunnel junction element, the storage element M is not limited to the ferromagnetic tunnel junction element. A known storage element, such as a N-channel MOSFET constituting a flash memory may also be used. In this case, the word lines 8 and the bit lines 9 may be appropriately provided in accordance with a writing mode and a reading-out mode of the data to/from the storage elements M.

Column drive control sections 10 are connected to an end of each of the word lines 8 and an end of each of the sense lines. Each of the column drive control sections 10 is connected to a column decoder 11 so as to operate in accordance with a control signal from the column decoder 11. Moreover, a row drive control section 12 is connected to an end of each of the bit lines 9. Each of the row drive control sections 12 is connected to a row decoder 13 so as to operate in accordance with a control signal from the row decoder 13.

A column address data output section 14 is connected to the column decoder 11, whereas a row address data output section 15 is connected to the row decoder 13. An external input signal for specifying a predetermined one of the storage elements M is configured to be input from the column address data output section 14 to the column decoder 11 as a column address data signal 14s and to be input from the row address data output section 15 to the row address decoder 13 as a row address data signal 15s.

Although it is depicted in FIG. 1 that the column address data output section 14 and the row address data output section 15 are provided outside of the data storage circuit 1, the data storage circuit 1 may be configured to include the column address data output section 14 and the row address data output section 15.

The column decoder 11 performs decoding in accordance with the input column address data signal 14s so as to operate any one of the column drive control sections 10 connected to the column decoder 11. The row decoder 13 performs decoding in accordance with the input row address data signal 15s so as to operate any one of the row drive control sections 12 connected to the row decoder 13. The storage element M, which is positioned at a crossing point between the word line 8 or the sense line connected to the column drive control section 10 currently being operated and the bit line 9 connected to the row drive control section 12 similarly currently being operated, is brought into an operating state so as to enable the write/readout of data to/from the storage element M.

In particular, in a case of writing new data to the storage element M or in a case of reading out existing data from the storage element M, the column address data signal 14s output from the column address data output section 14 and the row address data signal 15s output from the row address data output section 15 bring the storage element M, to/from which writing or reading-out is performed, into an operating state in advance.

Furthermore, since the ferromagnetic tunnel junction element is used as the storage element M in this embodiment, the new data input lines 6 are connected to the row drive control sections 12, respectively. Then, the predetermined storage element M is brought into an operating state as described above and a new data signal 6s is input to the row drive control section 12 through the new data input line 6, so that the row drive control section 12 allows a current to pass through the bit line 9 in a predetermined direction, thereby writing the new data to the storage element M.

On the other hand, for reading out the existing data stored in the storage element M, the storage element M, from which reading-out is performed, is brought into an operating state as described above. A resistance value of the storage element M is detected by using the sense line so as to generate an existing data signal in accordance with the resistance value detected in the column drive control section 10 and to output it to the column decoder 11.

The data storage circuit 1 is normally in a protected state where a storage state in the storage element M is prevented from being automatically varied by an erroneous input of a noise and the like. By inputting the write signal 7s to the data storage circuit 1 as 20, described above, the storage section 3 of the data storage circuit 1 allows the input of the new data only when the write signal 7s is input to enable the writing of the new data.

In particular, with the detection of the write signal 7s, a readout control signal 16s and a write control signal 17s are generated in the control signal generating section 4 for detecting the write signal 7s in the data storage circuit 1. The readout control signal 16s is a control signal for performing reading-out of the existing data from the storage element M to which the new data is to be stored. The write control signal 17s is a control signal for performing writing of the new data to the storage element M.

Figure 2:
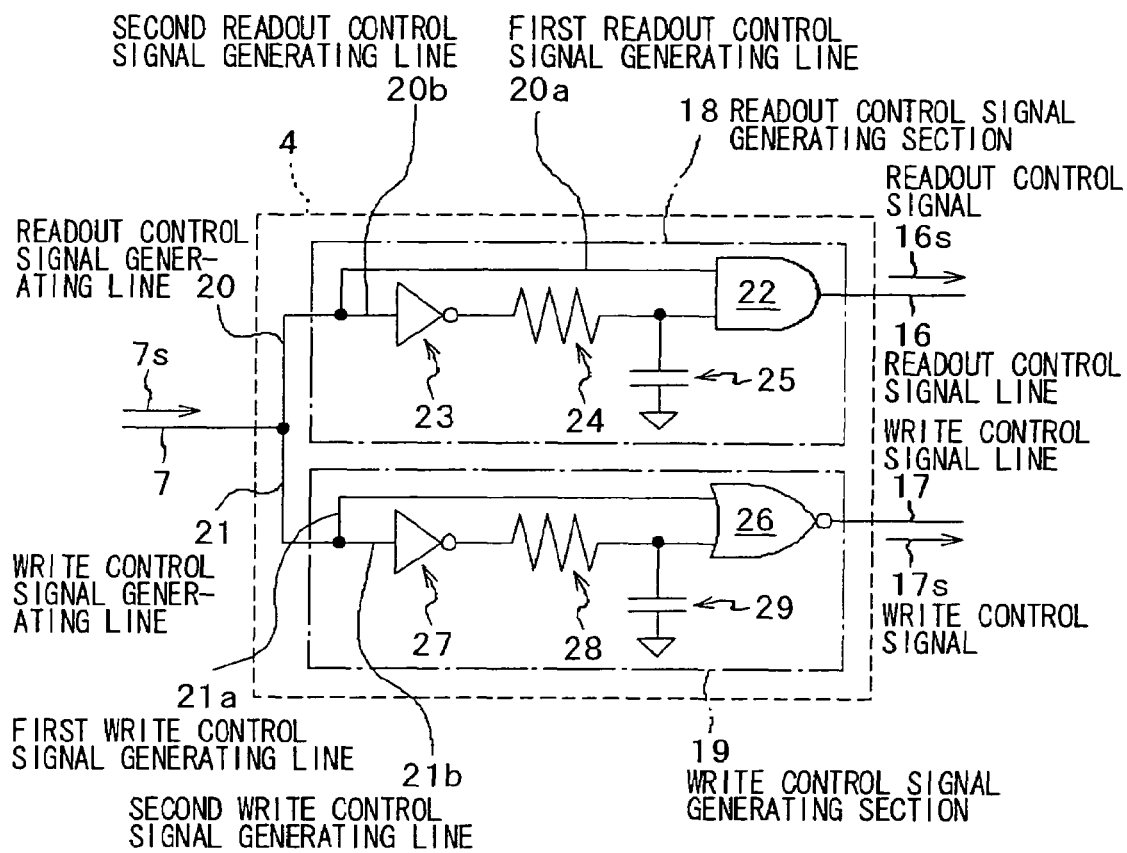
FIG. 2 is a circuit diagram explaining a configuration of a control signal generating section.

As shown in FIG. 2, a readout control signal generating section 18 and a write control signal generating section 19 are provided in parallel in the control signal generating section 4 so as to generate the readout control signal 16s and the write control signal 17s from the write signal 7s.

More specifically, in the control signal generating section 4, the write signal line 7 is branched into a readout control signal generating line 20 and a write control signal generating line 21 so as to input the write signal 7s to the readout control signal generating section 18 and the write control signal generating line 19, respectively. In this manner, the readout control signal 16s is generated in the readout control signal generating section 18, whereas the write control signal 17s is generated in the write control signal generating section 19.

In the readout control signal generating section 18, the readout-control signal generating line 20 is further branched into a first readout control signal generating line 20a and a second readout control signal generating line 20b. The first readout control signal generating line 20a and the second readout control signal generating line 20b are connected to an AND gate 22 which generates the readout control signal 16s.

Figure 3:
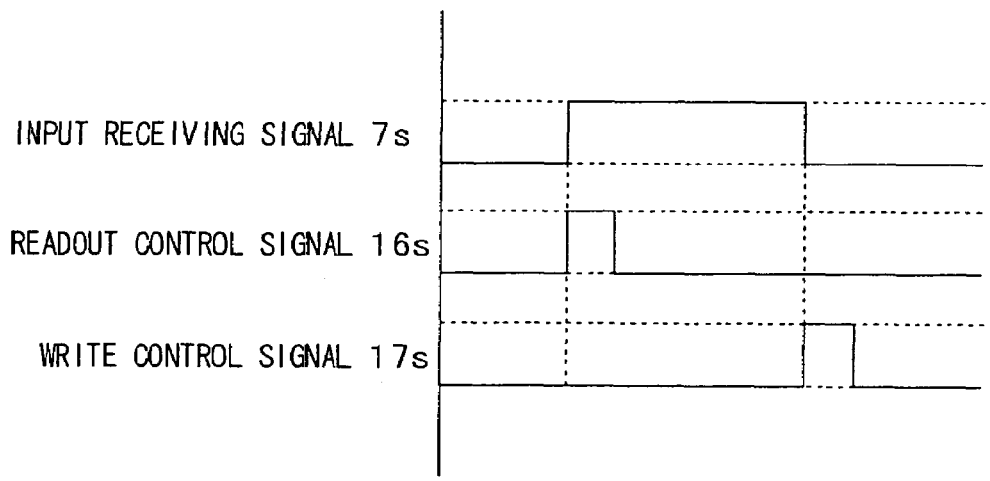
FIG. 3 is an explanatory view of a readout control signal and a write control signal generated at the control signal generation section.

At this time, a NOT gate 23 is provided in the middle of the second readout control signal generating line 20b. Furthermore, a resistor 24 is provided on the output side of the NOT gate 23 to which an end of a capacitor 25 is connected. As a result, as shown in FIG. 3, the readout control signal generating section 18 detects a rise of the write signal 7s to generate the readout control signal 16s so as to output it from the readout control signal line 16 connected to the AND gate 22.

Moreover, in the write control signal generating section 19, the write control signal generating line 21 is also further branched into a first write control signal generating line 21a and a second write control signal generating line 21b. The first write control signal generating line 21a and the second write control signal generating line 21b are connected to a NOR gate 26 which generates the write control signal 17s.

At this time, a NOT gate 27 is provided in the middle of the second write control signal generating line 21b. Furthermore, a resistor 28 is provided on the output side of the NOT gate 27, to which an end of a capacitor 29 is connected. As a result, as shown in FIG. 3, the write control signal generating section 19 detects a fall of the write signal 17s to generate the write control signal 17s so as to output it from the write control signal line 17 connected to the NOR gate 26.

More specifically, since the readout control signal 16s and the write control signal 17s can be generated from the same write signal 7s, the readout control signal 16s and the write control signal 17s, which have a predetermined difference in time therebetween, can be generated with good accuracy with an extremely simple structure. Therefore, the control of the comparison section 5 described below by the readout control signal 16s and the write control signal 17s can be ensured.

As shown in FIG. 1, the readout control signal line 16 and the write control signal line 17 are connected to the column decoder 11 and the row decoder 13 so as to control the column decoder 11 and the row decoder 13 in accordance with the readout control signal 16s and the write control signal 17s in a manner described below. Furthermore, the readout control signal line 16 and the write control signal line 17 are respectively connected to each of the column drive control sections 10 and each of the row drive control sections 12 so as to control the column drive control sections 10 and the row drive control sections 12 in accordance with the readout control signal 16s and the write control signal 17s in a manner described below.

The readout control signal line 16 and the write control signal line 17 are also connected to the comparison section 5 so that the readout control signal 16s and the write control signal 17s are input to the comparison section 5 to control the comparison section 5.

Furthermore, the new data input line 6 and an existing data input line 30 that is connected to the row decoder 11 are connected to the comparison section 5 so as to input thereto the new data signal 6s and an existing data signal 30s to be compared with each other.

Figure 4:
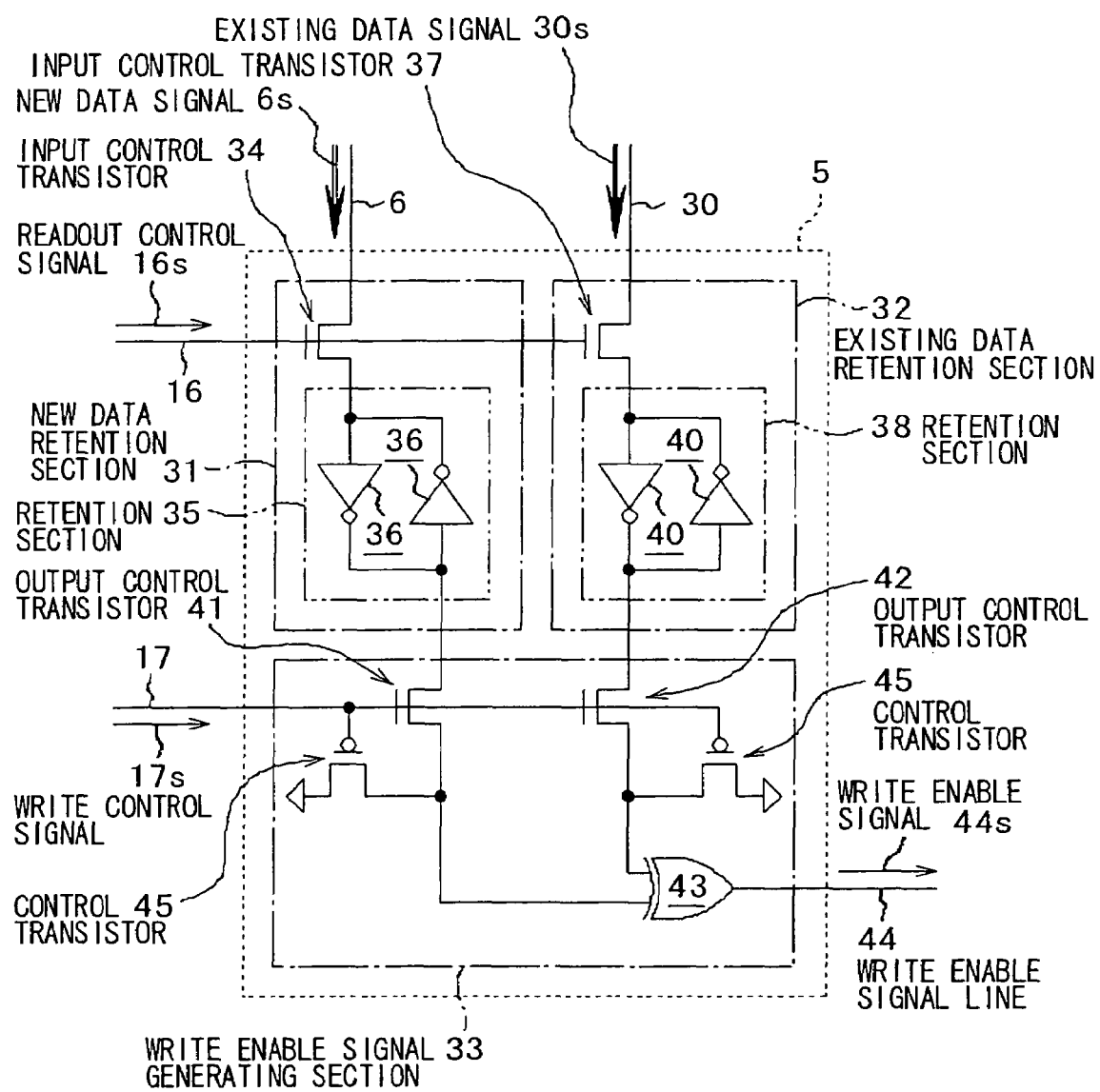
FIG. 4 is a circuit diagram explaining a configuration of a comparison section.

As shown in FIG. 4, the comparison section 5 is configured with a new data signal retention section 31 for temporarily retaining the new data signal 6s input through the new data input line 6; an existing data signal retention section 32 for temporarily retaining the existing data signal 30s input through the existing data input line 30; and a write enable signal generating section 33 for comparing the new data signal 6s retained in the new data signal retention section 31 and the existing data signal 30s retained in the existing data signal retention section 32 with each other.

The new data signal retention section 31 is configured with an input control transistor 34 for controlling an input of the new data signal 6s to the new data signal retention section 31; and a retention section 35 for retaining the new data signal 6s input to the new data signal retention section 31.

The readout control signal line 16 is connected to a gate electrode of the input control transistor 34. The readout control signal 16s is input to the gate electrode so that the new data signal 6s is input from the new data input line 6 connected to the input control transistor 34 to the retention section 35 connected to the input control transistor 34.

The retention section 35 is a simple storage circuit consisting of a latch composed of the combination of two inverters 36, which is capable of retaining the new data signal 6s for a certain period of time.

Similarly to the new data signal retention section 31, the existing data signal retention section 32 is also configured with an input control transistor 37 for controlling an input of the existing data signal 30s to the existing data signal retention section 32; and a retention section 38 for retaining the existing data signal 30s input to the existing data signal retention section 32.

The readout control signal line 16 is connected to a gate electrode of the input control transistor 37. The readout control signal 16s is input to the gate electrode so that the existing data signal 30s is input from the existing data input line 30 connected to the input control transistor 37 to the retention section 38 connected to the input control transistor 37.

The retention section 38 is a simple storage circuit consisting of a latch composed of a combination of two inverters 40, 40, which is capable of retaining the existing data signal 30s for a certain period of time.

The write enable signal generating section 33 is configured with an output control transistor 41 for controlling an output of the new data signal 6s from the new data signal retention section 31; an output control transistor 42 for controlling an output of the existing data signal 30s from the existing data signal retention section 32; and an XOR gate 43 for inputting the new data signal 6s and the existing data signal 30s output respectively from the retention sections 35 and 38 by the output control transistors 41 and 42 thereto.

In particular, the write control signal line 17 is connected to gate electrodes of the output control transistors 41 and 42, respectively. The write control signal 17s is input to the output control transistors 41 and 42 through the write control signal line 17 so as to output the new data signal 6s and the existing data signal 30s from the retention sections 35 and 38 to the XOR gate 43.

In a case where the input new data signal 6s and the existing data signal 30s are not identical with each other, the XOR gate 43 outputs the write enable signal 44s from the write enable signal line 44 connected to the XOR gate 43. In a case where the new data signal 6s and the existing data signal 30s are identical with each other, it does not output the write enable signal 44s.

It is possible to extremely easily compare the new data signal 6s and the existing data signal 30s by inputting the write control signal 17s to the gate signals of the output control transistors 41 and 42 and to simultaneously output the new data signal 6s and the existing data signal 30s from the new data signal retention section 31 and the existing data signal retention section 32. As a result, it is possible to simplify the structure of the write enable signal generating section 33.

Furthermore, since determination processing in the write enables signal generating section 33 can be performed within a short period of time, a processing speed can be improved.

Except for the time of inputting the write control signal 17s, an erroneous operation protect signal is input to the XOR gate 43 so as to prevent the XOR gate 43 from erroneously outputting the write enable signal 44s. In this embodiment, the control transistors 41, 42 and 45, each having the gate electrode to which the write control signal line 17 is connected, are used to control the erroneous operation protect signal.

As shown in FIG. 1, the write enable signal line 44 is configured so that it is connected to each of the column drive control sections 10 and each of the row drive control sections 12 so as to input the write enable signal 44s to each of the column drive control sections 10 and each of the row drive control sections 12.

Finally, in accordance with a flowchart of FIG. 5, an operation for storing the new data in the data storage circuit 1 configured as described above will be described. When the new data is to be stored in the predetermined storage element M, the storage element M is brought into an operation state in advance as described above (step S1).

Then, to the data storage circuit 1, the new data signal 6s is input from the new data input line 6 (step S2) while the write signal 7s is input from the write signal line 7 (step S3).

In accordance with the input of the write signal 7s, the control signal generating section 4 first outputs the readout control signal 16s through the readout control signal line 16 (step S4) so as to input it to the column decoder 11, the row decoder 13, each of the column drive control sections 10, and each of the row drive control sections 12, thereby reading out the existing data stored in the predetermined storage element M to the column decoder 11. The column decoder 11 outputs the readout existing data as the existing data signal 30s to the existing data input line 30 connected to the column decoder 11 (step S5). This corresponds to readout processing.

The control signal generating section 4 also inputs the readout control signal 16s to the comparison section 5. In the comparison section 5, in response to the input of the readout control signal 16s, the new data signal 6s is input to the new data signal retention section 31 of the comparison section 5 so as to be temporarily retained therein, whereas the existing data signal 30s is input to the existing data signal retention section 32 so as to be temporarily retained therein (step S6).

After a predetermined period of time, the control signal generating section 4 generates the write control signal 17s in accordance with the write signal 7s so as to input the write control signal 17s to the comparison section 5 (step S7). The write control signal 17s regulates the write signal 7s so that it is output from the control signal generating section 4 after an elapse of a sufficient period of time to input the new data signal 6s and the existing data signal 30s to the comparison section 5 by the readout control signal 16s.

The comparison section 5 outputs and compares the new data signal 6s retained in the new data signal retention section 31 and the exiting data signal 30s retained in the existing data signal retention section 32 in accordance with the input write control signal 17s (step S8).

In a case where the new data signal 6s and the existing data signal 30s are not identical with each other, it means the new data and the existing data are different from each other. Therefore, the comparison section 5 outputs the write enable signal 44s (step S9).

At this time, the write control signal 17s output from the control signal generating section 4 is also input to the column decoder 11, the row decoder 13, each of the column drive control sections 10 and each of the row drive control sections 12 through the write control signal line 17. Furthermore, the write enable signal 44s output from the comparison section 5 is input to each of the column drive control sections 10 and each of the row drive control sections 12 through the write enables signal line 44, so that the storage section 3 writes the new data to the predetermined storage element M (step S10). This corresponds to write processing.

On the other hand, in the comparison between the new data signal 6s and the existing data signal 30s in the comparison section 5 (step S8), in a case where the new data signal 6s and the existing data signal 30s are identical with each other, that is, in a case where the new data and the existing data are identical with each other, the comparison section 5 does not output the write enable signal 44s. The write processing is terminated while the storage section 3 does not write the new data to the predetermined storage element M.

Since the existing data already stored in the storage element M is the same as the new data even if the new data is not written to the storage element M, no problem arises.

As described above, in a case where the new data to be stored in the storage element M is identical with the existing data already stored in the storage element M to which the new data is to be written, the new data is not written. As a result, the power consumption, which would otherwise be generated by writing the new data, can be reduced, thereby achieving a power saving.

By providing the above-described data storage circuit 1 on a semiconductor substrate, a data storage device achieving a power reduction can be formed. By using the data storage device, a CPU including an IC memory or a storage area with a power reduction can be formed.

INDUSTRIAL APPLICABILITY (1) In an embodiment of the present invention, by providing a comparison section for reading out existing data stored in a storage element to compare the existing data and new data with each other prior to writing of the new data to the storage element, and configuring so that, in the comparison section, in a case where the exiting data and the new data are identical with each other, the writing to the storage element is not performed, and in a case where the existing data and the new data are not identical with each other, the new data is written to the storage element, it is possible to substantially reduce the number of times of execution of writing to the storage element so that power consumption brought by the writing of the new data can be suppressed to accomplish power saving.

In particular, since a probability that the existing data and the new data will be identical with each other is about 50%, the power required to write the data to the storage element can be approximately halved.

(2) According to an embodiment of the invention, by providing the data storage circuit with a control signal generating section for generating a readout control signal for performing readout control of the existing data and a write control signal for performing write control of the new data, and by configuring the data storage circuit so that the existing data and the new data are compared with each other in the comparison section in accordance with the control signal from the control signal generating section, the readout control signal and the write control signal generated with good accuracy can surely perform control of the data storage circuit and avoid erroneous operation to prevent excess power consumption. In particular, it is possible to adjust a time difference between the readout control signal and the write control signal generated with a predetermined time difference therebetween to be minimal so that the processing at the comparison section can be performed at high speed.

(3) According to an embodiment of the invention as described in claim 3, by performing a readout process of existing data stored in a storage element prior to performing a write process of the new data to the storage element to compare the existing data and the new data with each other so as not to perform the writing to the storage element in a case where the exiting data and the new data are identical with each other and so as to perform writing of the new data to the storage element in a case where the existing data and the new data are not identical with each other, similarly to the invention as described in claim 1, it is possible to substantially reduce the number of times of execution of writing to the storage element so that power consumption brought by the writing of the new data can be suppressed to accomplish a power saving because the writing is not performed in a case of the existing data and the new data being identical to each other.

(4) According to an embodiment of the invention, by generating a readout control signal and a write control signal in accordance with a write signal input to the data storage circuit and by reading out the existing data in accordance with the readout control signal to compare the existing data with the new data in accordance with the write control signal, it is possible to perform the write processing of the new data immediately subsequent to the readout processing of the existing data so that processing speed can be improved and erroneous operation is avoided to prevent excess power consumption.

(5) According to an embodiment of the invention, by providing a comparison section for reading out existing data stored in a storage element to compare the existing data and new data with each other prior to writing of the new data to the storage element, and configuring so that, in the comparison section, in a case where the existing data and the new data are identical with each other, the writing to the storage element is not performed, and in a case where the existing data and the new data are not identical with each other, the new data is written to the storage element, similarly to the invention as described in claim 1, it is possible to substantially reduce the number of times of execution of writing to the storage element so that power consumption brought by the writing of the new data can be suppressed to accomplish a power saving.

(6) According to an embodiment of the invention, by providing the data storage device with a control signal generating section for generating a readout control signal for performing readout control of the existing data and a write control signal for performing write control of the new data, and by configuring the data storage circuit so that the existing data and the new data are compared with each other in the comparison section in accordance with the control signal from the control signal generating section, similarly to the invention as described in claim 2, the readout control signal and the write control signal generated with good accuracy can surely perform control of the data storage circuit and avoid erroneous operation to prevent excess power consumption. In particular, it is possible to adjust a time difference between the readout control signal and the write control signal generated with a predetermined time difference therebetween to be minimal so that the processing at the comparison section can be performed at a high speed.

(7) According to an embodiment of the invention, by providing the comparison section with a new data retention section for temporarily retaining the new data; an existing data retention section for temporarily retaining the existing data; and a write enable signal generating section for comparing the new data retained in the new data retention section and the exiting data retained in the existing data retention section with each other to control an output of the write enable signal, and configuring so that the new data is temporarily retained in the new data retention section while the existing data is temporarily retained in the exiting data retention section in accordance with the readout control signal output from the control signal generating section so as to compare the new data retained in the new data retention section and the existing data retained in the existing data retention section with each other in accordance with the write control signal output from the control signal generating section, it is possible to compare the new data and the existing data after correctly obtaining them, respectively, so as to avoid an erroneous operation so that excessive power consumption can be prevented.

The invention claimed is:

1. A data storage circuit comprising:
   a comparison section for reading out existing data stored in a storage element to compare said existing data and new data with each other prior to writing of said new data to said storage element, wherein:
      when the comparison section determines that the existing data and the new data are identical, the new data is not written to the storage element, and
      when the comparison section determines that the existing data and the new data are not identical, the new data is written to the storage element; and
   a control signal generating section for generating a readout control signal and a write control signal from a write signal input to said control signal generating section, said readout control signal for performing readout control of the existing data and said write control signal for performing write control of the new data, wherein the existing data and the new data are compared with each other in the comparison section in accordance with the write control signal from the control signal generating section;
   wherein said control signal generating section includes an AND logic gate for generating said readout control signal, and a NOR logic gate for generating said write control signal; and
   wherein the pulse of the readout control signal and write control signal are shorter than the pulse of the write signal input to said control signal generating section.

2. A method for writing data in a data storage circuit, comprising:
   reading out existing data stored in a storage element prior to writing new data to the storage element to compare the existing data and the new data to each other;
   writing the new data to the storage element when the existing data and said new data are identical with each other, and so as to perform the write process of said new data to said storage element in a case where said existing data and said new data are not identical with each other; and
   generating a readout control signal and a write control signal in accordance with a write signal input to the data storage circuit;
   reading out the existing data in accordance with the readout control signal; and
   comparing the existing data with the new data in accordance with the write control signal;
   wherein said generating step includes using an AND logic gate to generate said readout control signal, and a NOR logic gate to generate said write control signal; and
   wherein the pulse of the generated readout control signal and write control signal are shorter than the pulse of the write signal input to the data storage circuit.

3. A data storage device comprising:
   a comparison section for reading out existing data stored in a storage element and compare the existing data and new data to each other prior to writing the new data to the storage element, wherein
      when the comparison section determines that the existing data and new data are identical, the new data is not written to the storage element, and
      when the comparison section determines that the existing data and new data are not identical, the new data is written to the storage element;
   a control signal generating section for generating a readout control signal and a write control signal from a write signal input to said control signal generating section, said readout control signal for performing readout control of the existing data and a write control signal for performing write control of the new data, wherein the existing data and the new data are compared to each other in the comparison section, in accordance with a control signal from said control signal generating section;

wherein said control signal generating section includes an AND logic gate for generating said readout control signal, and a NOR logic gate for generating said write control signal; and wherein the pulse of the readout control signal and write control signal are shorter than the pulse of the write signal input to said control signal generating section.

4. The data storage device as described in claim 3, wherein the comparison section comprises:

a new data retention section for temporarily retaining the new data;

an existing data retention section for temporarily retaining the existing data; and a write enable signal generating section for comparing the new data retained in the new data retention section and the existing data retained in the existing data retention section with each other to control an output of the write enable signal, wherein, the new data is temporarily retained in the new data retention section while the existing data is temporarily retained in the existing data retention section in response to the readout control signal output from the control signal generating section, and the new data retained in the new data retention section and the existing data retained in the existing data retention section are compared to each other in response to the write control signal output from the control signal generating section.

5. The data storage device according to claim 4, wherein said new data retention section and existing data retention section include input control transistors for controlling the retaining of the new data and the existing data in accordance with readout control signal.

6. The data storage device according to claim 4, wherein the write enable signal generation section includes output control transistors for controlling comparison of the new data and the existing data in accordance with the write control signal.

7. The data storage device according to claim 4, wherein the write enable signal generation section includes an XOR logic gate for generating a write enable signal in accordance with the new data and the existing data.

* * * * *